US012635132B2

(12) United States Patent
Li

(10) Patent No.: US 12,635,132 B2

(45) Date of Patent: May 19, 2026

(54) ANTIFUSE-TYPE NON-VOLATILE MEMORY CELL

(71) Applicant: eMemory Technology Inc., Hsin-Chu (TW)

(72) Inventor: Yi-Hung Li, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 176 days.

(21) Appl. No.: 18/520,610

(22) Filed: Nov. 28, 2023

(65) Prior Publication Data

US 2024/0276715 A1 Aug. 15, 2024

Related U.S. Application Data

(60) Provisional application No. 63/444,601, filed on Feb. 10, 2023.

(51) Int. Cl.

*H10B 20/25* (2023.01)

*G11C 17/16* (2006.01)

(52) U.S. Cl.

CPC ........... *H10B 20/25* (2023.02); *G11C 17/165* (2013.01)

(58) Field of Classification Search

CPC ...................................................... H10B 20/25

See application file for complete search history.

(56) References Cited

U.S. PATENT DOCUMENTS 9,362,001 B2 6/2016 Wu et al.
9,634,015 B2 4/2017 Wong et al.
2008/0171412 A1* 7/2008 Cheng .................. H10D 64/662 257/E21.403
2021/0217756 A1* 7/2021 Li ....................... H01L 23/5252

FOREIGN PATENT DOCUMENTS

TW 201513269 A 4/2015
TW 201913674 A 4/2019

OTHER PUBLICATIONS

Office Action issued by Taiwan Intellectual Property Office on Sep. 4, 2024.

* cited by examiner

*Primary Examiner* — Hoai V Ho

(74) *Attorney, Agent, or Firm* — WPAT, PC

(57) ABSTRACT

An antifuse-type non-volatile memory cell includes a select transistor, a following transistor and a capacitor. The first drain/source terminal of the select transistor is connected with a bit line. The gate terminal of the select transistor is connected with a word line. A first drain/source terminal of the following transistor is connected with a second drain/source terminal of the select transistor. A gate terminal of the following transistor is connected with a following line. A second drain/source terminal of the following transistor is connected with a first terminal of the capacitor. A second terminal of the capacitor is connected with an antifuse control line.

15 Claims, 8 Drawing Sheets

ANTIFUSE-TYPE NON-VOLATILE MEMORY CELL

This application claims the benefit of U.S. provisional application Ser. No. 63/444,601, filed Feb. 10, 2023, the subject matters of which are incorporated herein by references.

FIELD OF THE INVENTION

The present invention relates to a non-volatile memory cell, and more particularly to an antifuse-type non-volatile memory cell.

BACKGROUND OF THE INVENTION

An antifuse-type non-volatile memory is a one time programming memory (also referred as an OTP memory). Before the antifuse-type non-volatile memory is programmed, the antifuse-type non-volatile memory is in a high-resistance storage state. After the antifuse-type non-volatile memory is programmed, the antifuse-type non-volatile memory is in a low-resistance storage state.

With the increasing advance of the semiconductor manufacturing process, the process of manufacturing the antifuse-type non-volatile memory is compatible with the CMOS semiconductor manufacturing process. A silicide formation process in the CMOS semiconductor manufacturing process will be described as follows.

Generally, three silicide layers are respectively formed on and contacted with a gate layer, a drain region and a source region of a metal-oxide-semiconductor transistor (also referred hereinafter as a MOS transistor) and used as three electrodes of the MOS transistor. Since the contact resistance between the silicide layer and the conduction area (i.e., the gate layer, the drain region or the source region) is low, silicide is suitably used as the material of the electrode.

FIGS. 1A to 1F are schematic cross-sectional views illustrating a silicide formation process in a conventional CMOS semiconductor manufacturing process.

Please refer to FIG. 1A. Firstly, plural isolation structures 109 are formed in a semiconductor substrate Sub. In addition, an N-well region NW and a P-well region PW are formed in the surface of the substrate Sub and arranged between the plural isolation structures 109. For example, the isolation structures 109 are shallow trench isolation (STI) structures, the semiconductor substrate Sub is a silicon substrate, and the isolation structures 109 are made of silicon dioxide ($SiO_2$).

Then, a gate structure 110 is formed over the surface of the N-well region NW, and another gate structure 120 is formed over the surface of the P-well region PW. The gate structure 110 comprises a gate dielectric layer 112, a gate layer 114 and a spacer 116. The gate structure 120 comprises a gate dielectric layer 122, a gate layer 124 and a spacer 126. The gate layers 114 and 124 are made of polysilicon. The gate dielectric layer 112 and 122 are made of silicon dioxide ($SiO_2$). The spacer 116 and 126 are made of silicon dioxide ($SiO_2$) or silicon Nitride (SiN).

Then, two doping processes are performed. Consequently, two p-doped regions 101 and 103 are formed in the N-well region NW and respectively located beside two sides of the gate structure 110, and two n-doped regions 105 and 107 are formed in the P-well region PW and respectively located beside two sides of the gate structure 120. Consequently, a p-type transistor Mp and an n-type transistor Mn are formed on the semiconductor substrate Sub. The N-well region NW, the gate structure 110, the p-doped region 101 and the p-doped region 103 are collaboratively formed as the p-type transistor Mp. The P-well region PW, the gate structure 120, the n-doped region 105 and the n-doped region 107 are collaboratively formed as the n-type transistor Mn.

Then, as shown in FIG. 1B, a metal film 130 is formed to cover the semiconductor substrate Sub. That is, the isolation structures 109, the p-doped region 101, the p-doped region 103, the n-doped region 105, the n-doped region and 107, the spacer 116, the spacer 126, the gate layer 114 and the gate layer 124 are covered by and contacted with the metal film 130.

Then, the resulting structure shown in FIG. 1B undergoes a heating process. Consequently, as shown in FIG. 1C, the contact regions between the metal film 130 and the silicon material are reacted and formed as silicide layers 131, 132, 133, 136, 137 and 138. In contrast, the contact regions between the metal film 130 and the non-silicon material are not subjected to any reaction.

The silicide layers 131, 132 and 133 are respectively formed on the p-doped region 101, the p-doped region 103 and the gate layer 114. In addition, the silicide layers 131, 132 and 133 are served as the three electrodes of the p-type transistor Mp. The silicide layers 136, 137 and 138 are respectively formed on the n-doped region 105, the n-doped region and 107 and the gate layer 124. In addition, the silicide layers 136, 137 and 138 are served as the three electrodes of the n-type transistor Mn. After the unreacted metal film 130 is removed, a connecting line formation process is performed.

Please refer to FIG. 1D. After the unreacted metal film 130 is removed, a contact etching stop layer (also referred as a CESL layer) 150 is formed over the semiconductor substrate Sub, and an interlayer dielectric layer (also referred as an IDL layer) 152 is formed over the CESL layer 150.

Please refer to FIG. 1E. After an etching process is performed on the IDL layer 152, plural contact holes are formed in the IDL layer 152 and respectively located over the silicide layers 131, 132, 133, 136, 137 and 138. Since the IDL layer 152 can only be etched to the CESL layer 150 only, the CESL layer 150 is exposed to the bottom sides of the contact holes.

Please refer to FIG. 1F. Then, the portions of the CESL layer 150 exposed to the bottom sides of the contact holes are removed. Consequently, the silicide layers 131, 132, 133, 136, 137 and 138 are exposed to the bottom sides of the contact holes. Then, conducting lines 161, 162, 163, 165, 167 and 168 are filled in the corresponding contact holes and electrically connected with the silicide layers 131, 132, 133, 136, 137 and 138, respectively.

As mentioned above, in the CMOS semiconductor manufacturing process, the silicide layers 131, 132, 133, 136, 137 and 138 are formed on the surfaces of the drain regions, the gate layers and the source regions and served as the electrodes of the MOS transistors Mp and Mn.

The silicide layers 131, 132, 133, 136, 137 and 138 are used as electrical contact layers. When the self-aligned process is used, the silicide layers can be also called as salicide layers.

As mentioned above, the manufacturing process of the antifuse-type non-volatile memory is compatible with the CMOS semiconductor manufacturing process. Since the CMOS semiconductor manufacturing process is continuously in progress, it is necessary to improve the structure of the antifuse-type non-volatile memory in order to achieve more reliable performance of the antifuse-type non-volatile memory.

SUMMARY OF THE INVENTION

An embodiment of the present invention provides an antifuse-type non-volatile memory cell. The antifuse-type non-volatile memory cell includes a semiconductor substrate, a well region, a first gate structure, a second gate structure, a third gate structure, a first doped region, a second doped region, a third doped region, a first protecting layer, a first electrical contact layer, a second electrical contact layer, a third electrical contact layer, a fourth electrical contact layer, a first conducting line, a second conducting line, a third conducting line and a fourth conducting line. The well region is formed in the semiconductor substrate. The first gate structure, the second gate structure and the third gate structure are formed over a surface of the well region. The first doped region is formed under the surface of the well region and arranged beside a first side of the first gate structure. The second doped region is formed under the surface of the well region and arranged between a second side of the first gate structure and a first side of the second gate structure. The third doped region is formed under the surface of the well region and arranged between a second side of the second gate structure and a first side of the third gate structure. A surface of the second doped region and a surface of the third doped region are completely covered by the first protecting layer. The first electrical contact layer, the second electrical contact layer, the third electrical contact layer and the fourth electrical contact layer contacted with a surface of the first doped region, the first gate structure, the second gate structure and the third gate structure, respectively. The first conducting line, the second conducting line, the third conducting line and the fourth conducting line electrically connected with the first electrical contact layer, the second electrical contact layer, the third electrical contact layer and the fourth electrical contact layer, respectively. The well region, the first gate structure, the first doped region and the second doped region are collaboratively formed as a first select transistor. The well region, the second gate structure, the second doped region and the third doped region are collaboratively formed as a following transistor. The third gate structure and the third doped region are collaboratively formed as a capacitor. The antifuse-type non-volatile memory cell includes the first select transistor, the first following transistor and the capacitor.

Another embodiment of the present invention provides an antifuse-type non-volatile memory cell. The antifuse-type non-volatile memory cell includes a semiconductor substrate, a well region, a first gate structure, a second gate structure, a first doped region, a second doped region, a first protecting layer, a first electrical contact layer, a second electrical contact layer, a third electrical contact layer, a first conducting line, a second conducting line and a third conducting line. The well region is formed in the semiconductor substrate. The first gate structure and the second gate structure are formed over a surface of the well region. The first doped region is formed under the surface of the well region and arranged beside a first side of the first gate structure. The second doped region is formed under the surface of the well region and arranged between a second side of the first gate structure and a first side of the second gate structure. A surface of the second doped region is completely covered by the first protecting layer. The first electrical contact layer, the second electrical contact layer and the third electrical contact layer are contacted with a surface of the first doped region, the first gate structure and the second gate structure, respectively. The first conducting line, the second conducting line and the third conducting line are electrically connected with the first electrical contact layer, the second electrical contact layer and the third electrical contact layer, respectively. The well region, the first gate structure, the first doped region and the second doped region are collaboratively formed as a first select transistor. The second gate structure and the second doped region are collaboratively formed as a capacitor. The antifuse-type non-volatile memory cell includes the first select transistor and the capacitor.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1A:
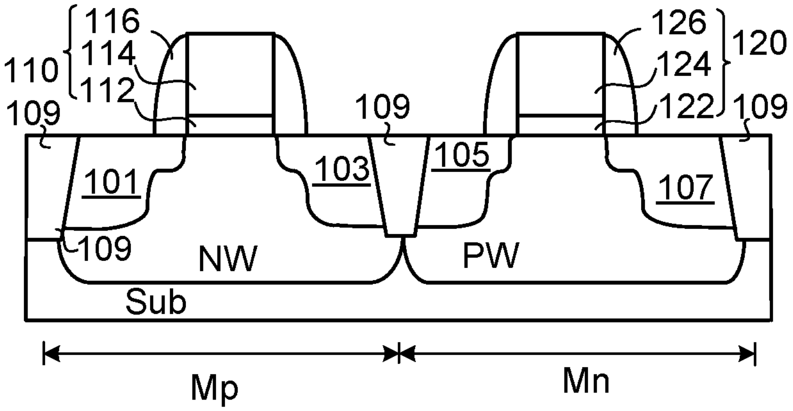
FIGS. 1A to 1F (prior art) are schematic cross-sectional views illustrating a silicide formation process in a conventional CMOS semiconductor manufacturing process.
Figure 1B:
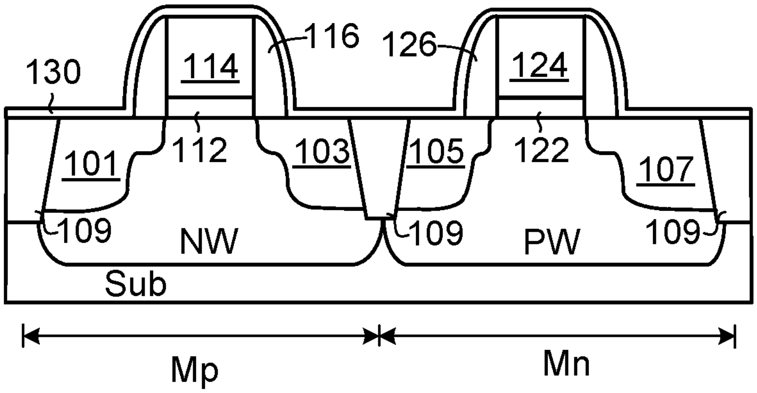
Figure 1C:
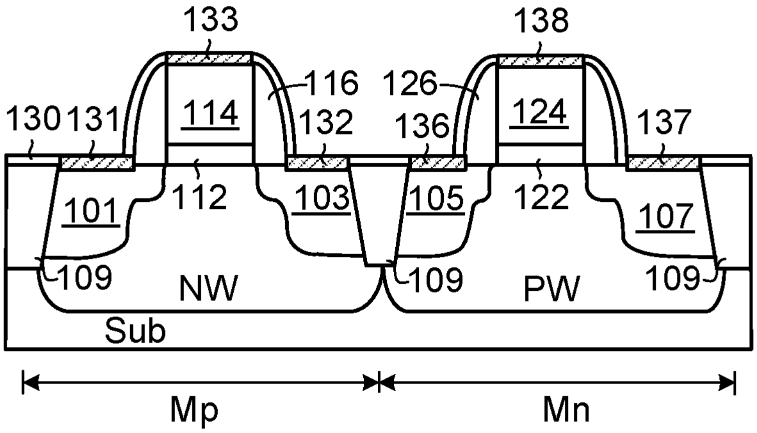
Figure 1D:
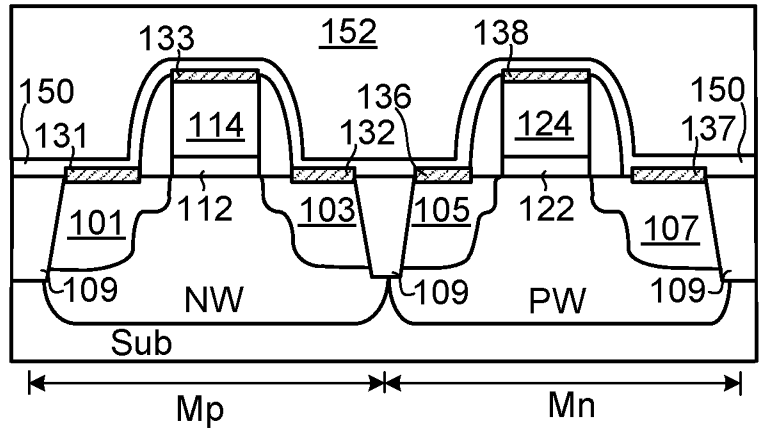
Figure 1E:
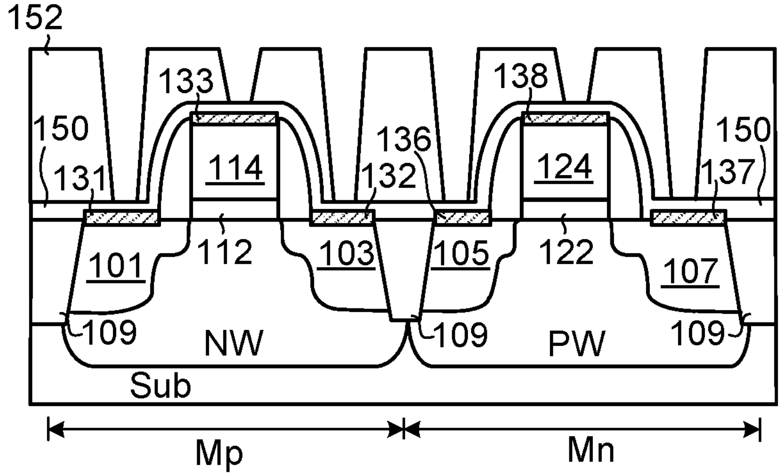
Figure 1F:
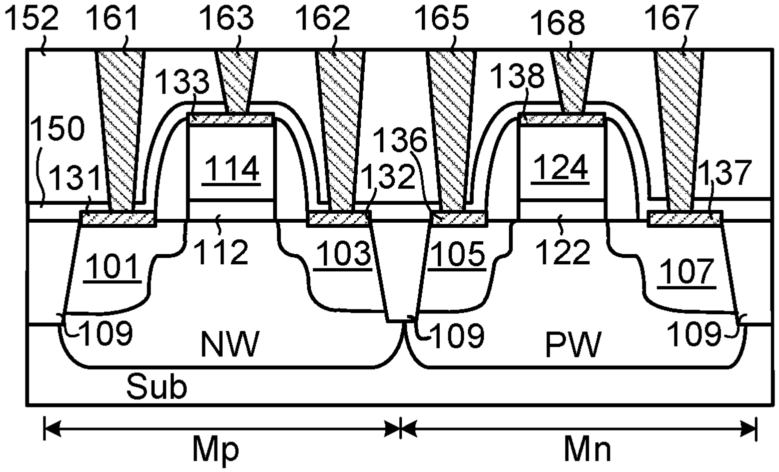
Figure 2A:
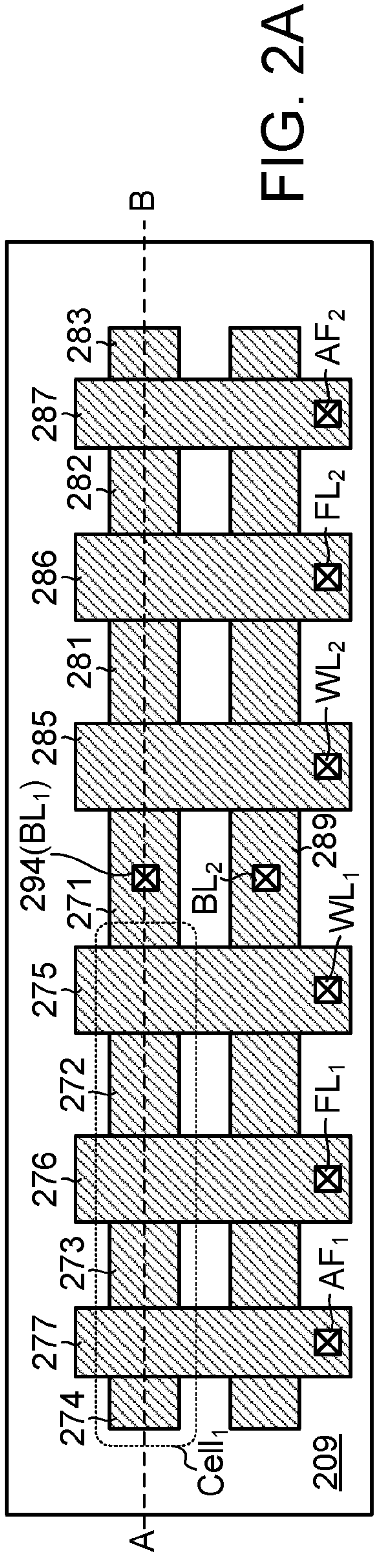
FIG. 2A is a schematic top view illustrating an array structure with plural antifuse-type non-volatile memory cells according to a first embodiment of the present invention.
Figure 2B:
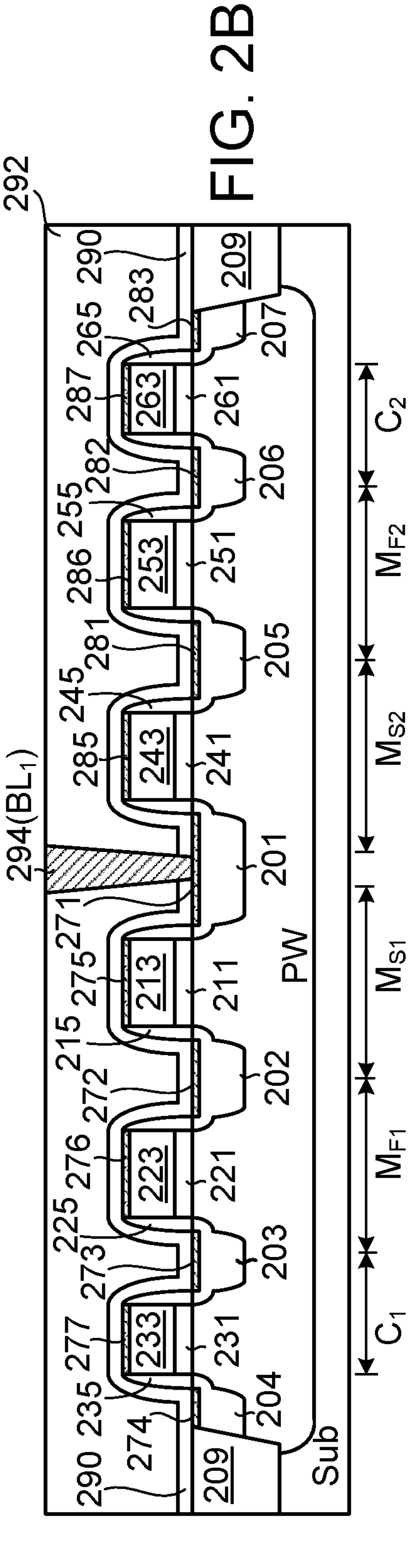
FIG. 2B is a schematic cross-sectional view illustrating the array structure as shown in FIG. 2A and taken along the dashed line AB.
Figure 2C:
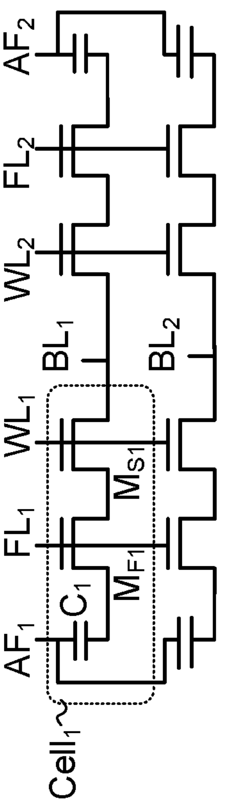
FIG. 2C is a schematic equivalent circuit of the array structure according to the first embodiment of the present invention.

FIG. 2A is a schematic top view illustrating an array structure with plural antifuse-type non-volatile memory cells according to a first embodiment of the present invention. FIG. 2B is a schematic cross-sectional view illustrating the array structure as shown in FIG. 2A and taken along the dashed line AB. FIG. 2C is a schematic equivalent circuit of the array structure according to the first embodiment of the present invention. Since the antifuse-type non-volatile memory cell of this embodiment comprises two transistors and one capacitor, the antifuse-type non-volatile memory cell may be referred as a 2T1C cell.

For brevity, the antifuse-type non-volatile memory cell is referred as a memory cell. The array structure comprises M×N antifuse-type non-volatile memory cells, wherein M and N are positive integers. For illustration, the array structure comprises 2×2 memory cells. The process of manufacturing the memory cell is compatible with the CMOS semiconductor manufacturing process. Consequently, the structure of the memory cell will be described, but the process of manufacturing the memory cell will not be described.

Please refer to FIG. 2B. Firstly, plural isolation structures 209 are formed in a semiconductor substrate Sub. In addition, a P-well region PW is formed in the surface of the semiconductor substrate Sub and arranged between the plural isolation structures 209. For example, the isolation structures 209 are shallow trench isolation (STI) structures, the semiconductor substrate Sub is a silicon substrate, and the isolation structures 209 are made of silicon dioxide ($SiO_2$).

Please refer to FIG. 2B again. Then, six gate structures are formed over the surface of the P-well region PW. The first gate structure comprises a gate dielectric layer 211, a gate layer 213 and a spacer 215. The second gate structure comprises a gate dielectric layer 221, a gate layer 223 and a spacer 225. The third gate structure comprises a gate dielectric layer 231, a gate layer 233 and a spacer 235. The fourth gate structure comprises a gate dielectric layer 241, a gate layer 243 and a spacer 245. The fifth gate structure comprises a gate dielectric layer 251, a gate layer 253 and a spacer 255. The sixth gate structure comprises a gate dielectric layer 261, a gate layer 263 and a spacer 265. The gate layers 213, 223, 233,243, 253 and 263 are made of polysilicon. The gate dielectric layers 211, 221, 231, 241, 251 and 261 are made of silicon dioxide ($SiO_2$), and the spacers 215, 225, 235, 245, 255, 265 are made of silicon dioxide ($SiO_2$) or silicon Nitride (SiN).

Then, a doping process is performed. An n-doped region 201 is formed under the surface of the P-well region PW and arranged between a first side (e.g., a right side) of the first gate structure and a first side (e.g., a left side) of the fourth gate structure. An n-doped region 202 is formed under the surface of the P-well region and arranged between a second side (e.g., a left side) of the first gate structure and a first side (e.g., a right side) of the second gate structure. An n-doped region 203 is formed under the surface of the P-well region and arranged between a second side (e.g., a left side) of the second gate structure and a first side (e.g., a right side) of the third gate structure. An n-doped region 204 is formed under the surface of the P-well region and arranged beside a second side (e.g., a left side) of the third gate structure. An n-doped region 205 is formed under the surface of the P-well region and arranged between a second side (e.g., a right side) of the fourth gate structure and a first side (e.g., a left side) of the fifth gate structure. An n-doped region 206 is formed under the surface of the P-well region and arranged between a second side (e.g., a right side) of the fifth gate structure and a first side (e.g., a left side) of the sixth gate structure. An n-doped region 207 is formed under the surface of the P-well region and arranged beside a second side (e.g., a right side) of the sixth gate structure.

After an electrical contact layer formation process is performed, plural electrical contact layers 271, 272, 273, 274, 275, 276, 277, 281, 282, 283, 285, 286 and 287 are formed. The electrical contact layers 271, 272, 273, 274, 281, 282 and 283 are contacted with the surfaces of the n-doped regions 201, 202, 203, 204, 205, 206 and 207, respectively. Furthermore, plural electrical contact layers 275, 276, 277, 285, 286 and 287 are contacted with the first gate structure, the second gate structure, the third gate structure, the fourth gate structure, the fifth gate structure and the sixth gate structure, respectively. That is, the electrical contact layers 275, 276, 277, 285, 286 and 287 are contacted with the surfaces of the gate layers 213, 223, 233, 243, 253 and 263, respectively. Moreover, the electrical contact layers 271, 272, 273, 274, 275, 276, 277, 281, 282, 283, 285, 286 and 287 are made of silicide.

Then, a connecting line process is performed. A contact etching stop layer (also referred as a CESL layer) 290 is formed over the semiconductor substrate Sub, and an interlayer dielectric layer (also referred as an IDL layer) 292 is formed over the CESL layer 290. Then, as shown in FIG. 2B, a conducting line 294 is formed. The conducting line 294 is electrically connected with the electrical contact layer 271. The conducting line 294 is served as a bit line $BL_1$.

After the conducting line formation process is completed, some other conducting lines are formed. As shown in FIG. 2A, the conducting line connected with the electrical contact layer 277 is served as an antifuse control line $AF_1$. The conducting line connected with the electrical contact layer 276 is served as a following line $FL_1$. The conducting line connected with the electrical contact layer 275 is served as a word line $WL_1$. The conducting line connected with the electrical contact layer 287 is an antifuse control line $AF_2$. The conducting line connected with the electrical contact layer 286 is served as a following line $FL_2$. The conducting line connected with the electrical contact layer 285 is served as a second word line $WL_2$. The conducting line connected with the electrical contact layer 289 is served as a second bit line $BL_2$.

Please refer to FIG. 2B again. The P-well region PW, the first gate structure, the n-doped region 201 and the n-doped region 202 are collaboratively formed as a select transistor $M_{S1}$. The P-well region PW, the second gate structure, the n-doped region 202 and the n-doped region 203 are collaboratively formed as a following transistor $M_{F1}$. The third gate structure and the n-doped region 203 are collaboratively formed as a capacitor $C_1$. The P-well region PW, the fourth gate structure, the n-doped region 201 and the n-doped region 205 are collaboratively formed as a select transistor $M_{S2}$. The P-well region PW, the fifth gate structure, the n-doped region 205 and the n-doped region 206 are collaboratively formed as a following transistor $M_{F2}$. The sixth gate structure and the n-doped region 206 are collaboratively formed as a capacitor $C_2$. In the first embodiment of the present invention, a memory cell $Cell_1$ comprises the capacitor $C_1$, the following transistor $M_{F1}$ and the select transistor $M_{S1}$, and another memory cell comprises the capacitor $C_2$, the following transistor $M_{F2}$ and the select transistor $M_{S2}$. In this embodiment, the select transistors $M_{S1}$ and $M_{S2}$ and the following transistors $M_{F1}$ and $M_{F2}$ are n-type transistors.

As shown in FIG. 2C, the array structure comprises four memory cells with the same structures. The connection relationship between the components of the memory cell $Cell_1$ will be illustrated as an example. In the memory cell $Cell_1$, the first drain/source terminal of the select transistor $M_{S1}$ is connected with the bit line $BL_1$. The gate terminal of the select transistor $M_{S1}$ is connected with the word line $WL_1$. The first drain/source terminal of the following transistor $M_{F1}$ is connected with the second drain/source terminal of the select transistor $M_{S1}$. The gate terminal of the following transistor is connected with the following line $FL_1$. The first terminal of the capacitor $C_1$ is connected with the second drain/source terminal of the following transistor $M_{F1}$. The second terminal of the capacitor $C_1$ is connected with the antifuse control line $AF_1$.

By providing proper bias voltages to the bit line $BL_1$, the word line $WL_1$, the following line $FL_1$ and the antifuse control line $AF_1$, the memory cell Cell1 can be programed. For example, in case that the memory cell is not programmed, the gate dielectric layer 231 of the capacitor $C_1$ is not ruptured. Consequently, the memory cell $Cell_1$ is in a high-resistance storage state. Whereas, in case that the memory cell is programmed, the gate dielectric layer 231 of the capacitor $C_1$ is ruptured. Consequently, the memory cell $Cell_1$ is in a low-resistance storage state.

In the memory cell of the first embodiment, the electrical contact layers 272, 273, 274, 281, 282 and 283 are electrically contacted with the surfaces of the n-doped regions 202, 203, 204, 205, 206 and 207, respectively. However, the electrical contact layers 272, 273, 274, 281, 282 and 283 are not electrically connected with the corresponding conducting lines. In case that the surface of any of the n-doped regions 202, 203, 204, 205, 206 and 207 has crystal defect, the procedure of heating the electrical contact layers 272, 273, 274, 281, 282 and 283 may result in the formation of silicide spike material in the n-doped region. If the silicide spike material is electrically connected with the P-well region, some problems occur. For example, during the operations of the transistors, the memory cell $Cell_1$ may generate a leakage current to the P-well region. When the memory cell is subjected to the program action, the leakage current may cause program disturbance. Due to the program disturbance, the program action fails.

Figures 3A, 3B, 3C:
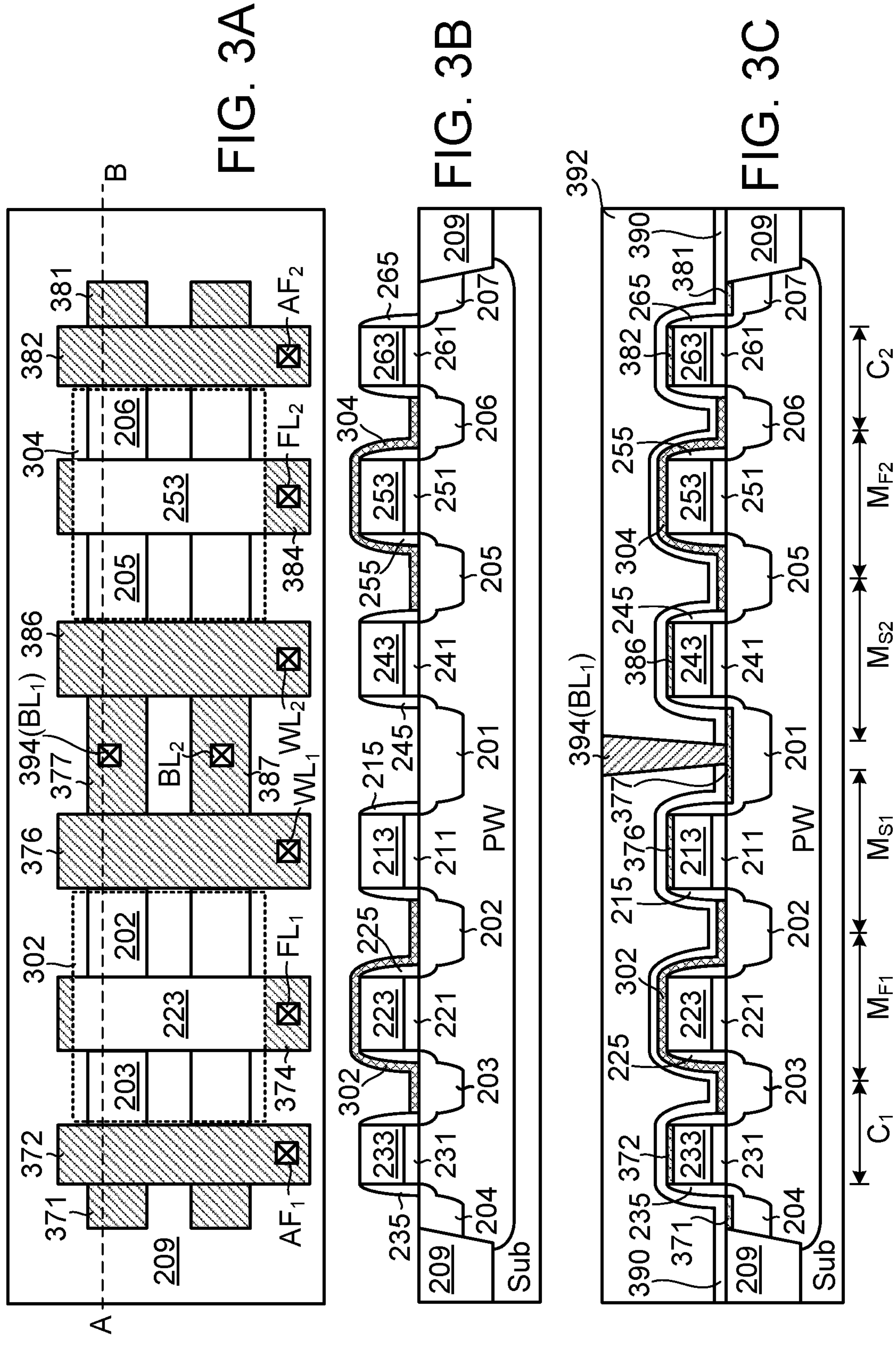
FIG. 3A is a schematic top view illustrating an array structure with memory cells according to a second embodiment of the present invention.
FIG. 3B is a schematic cross-sectional view illustrating a new step in the process of manufacturing the array structure as shown in FIG. 3A and taken along the dashed line AB.
FIG. 3C is a schematic cross-sectional view illustrating the array structure as shown in FIG. 3A and taken along the dashed line AB.

For solving the above problems, the structure of the memory cell of the first embodiment needs to be modified. FIG. 3A is a schematic top view illustrating an array structure with memory cells according to a second embodiment of the present invention. FIG. 3B is a schematic cross-sectional view illustrating a new step in the process of manufacturing the array structure as shown in FIG. 3A and taken along the dashed line AB. FIG. 3C is a schematic cross-sectional view illustrating the array structure as shown in FIG. 3A and taken along the dashed line AB. Similarly, the memory cell of the second embodiment is a 2T1C cell. Moreover, the equivalent circuit of the array structure of this embodiment is similar to that of the first embodiment, and not redundantly described herein.

The earlier steps of manufacturing the memory cell of the second embodiment are similar to the earlier steps of manufacturing the memory cell of the first embodiment. Please refer to FIG. 3B. Firstly, plural isolation structures 209 are formed in a semiconductor substrate Sub. In addition, a P-well region PW is formed in the surface of the substrate Sub and arranged between the plural isolation structures 209. Moreover, six gate structures are formed over the surface of the P-well region PW. Then, a doping process is performed. Consequently, plural n-doped regions 201, 202, 203, 204, 205, 206 and 207 are formed under the surface of the P-well region PW.

Before the electrical contact layer formation process, two protecting layers 302 and 304 are formed. The protecting layers 302 and 304 at least cover the surfaces of the n-doped regions 202, 203, 205 and 206. In some embodiments, at least part of the gate layer 223 and the spacer 225 are also covered by the protecting layer 302, and the at least part of the gate layer 253 and the spacer 255 are covered by the protecting layer 304. As shown in FIG. 3B, the n-doped regions 202 and 203 and the second gate structure between the first gate structure and the third gate structure are covered by the protecting layer 302. The n-doped regions 205 and 206 and the fifth gate structure between the fourth gate structure and the sixth gate structure are covered by the protecting layer 304. The protecting layers 302 and 304 are made of silicon dioxide ($SiO_2$) or silicon nitride.

Please refer to FIG. 3C. Since the surfaces of the n-doped regions 202, 203, 205 and 206 are covered by the protecting layers 302 and 304, no electrical contact layers can be formed on the surfaces of the n-doped regions 202, 203, 205 and 206. Consequently, after the electrical contact layer formation process, electrical contact layers 371, 377 and 381 are formed and contacted with the surfaces of the n-doped regions 204, 201 and 207, respectively. Moreover, electrical contact layers 372, 376, 382 and 386 are contacted with the third gate structure, the first gate structure, the sixth gate structure and the fourth gate structure, respectively. That is, the electrical contact layers 372, 376, 382 and 386 are contacted with the surfaces of the gate layers 233, 213, 263 and 243, respectively. Moreover, as shown in FIG. 3A, the second gate structure and the fifth gate structure are not completely covered by the protecting layers 302 and 304. That is, electrical contact layers 374 and 384 are contacted with a portion of the second gate structure and a portion of the fifth gate structure, respectively. As shown in FIG. 3A, the electrical contact layers 374 and 384 are respectively contacted with the exposed surfaces of the gate layers 223 and 253 that are not covered by the protecting layers 302 and 304. That is, the electrical contact layer 374 is formed on an exposed surface of the gate layer 223 that is not covered by the protecting layers 302, and the electrical contact layer 374 is not formed on the surface of the gate layer 223 that is covered by the protecting layers 302.

Then, a connecting line process is performed. A contact etching stop layer (also referred as a CESL layer) 390 is formed over the semiconductor substrate Sub, and an inter-layer dielectric layer (also referred as an IDL layer) 392 is formed over the CESL layer 390. As shown in FIG. 3C, the conducting line 394 connected with the electrical contact layer 377 is served as a bit line $BL_1$. Please refer to FIG. 3A. The conducting line connected with the electrical contact layer 372 is served as an antifuse control line $AF_1$. The conducting line connected with the electrical contact layer 374 is served as a following line $FL_1$. The conducting line connected with the electrical contact layer 376 is served as a word line $WL_1$. The conducting line connected with electrical contact layer 382 is served as an antifuse control line $AF_2$. The conducting line connected with the electrical contact layer 384 is served as a following line $FL_2$. The conducting line connected with the electrical contact layer 386 is served as a word line $WL_2$. The conducting line connected with the electrical contact layer 387 is served as a bit line $BL_2$.

Obviously, since the surface of the n-doped regions 202, 203, 205 and 206 in the memory cell of this embodiment are covered by the protecting layer 302 and 304 and no electrical contact layers are formed on the n-doped regions 202, 203, 205 and 206, silicide spike material cannot be formed in the n-doped regions 202, 203, 205 and 206. Consequently, during the program action of the memory cell, the program disturbance can be reduced, and the program fail problem can be solved.

In some embodiments, the protecting layers 302 and 304 of the second embodiment shown in FIG. 3C may respectively extend to cover the third gate structure and the sixth gate structure. Or, the protecting layers 302 and 304 may respectively extend to cover the first gate structure and the fourth gate structure. Or, the protecting layers 302 may extend to cover both the first gate structure and the third gate structure, and the protecting layers 304 may extend to cover both the fourth gate structure and the six gate structure.

Figure 3D:
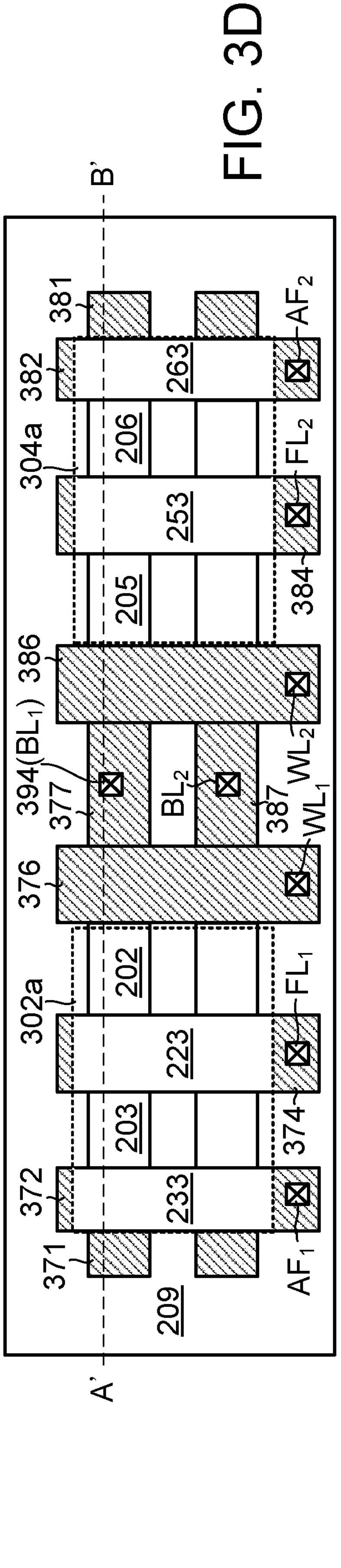
FIG. 3D is a schematic top view modified based on the second embodiment of FIG. 3A.
Figure 3E:
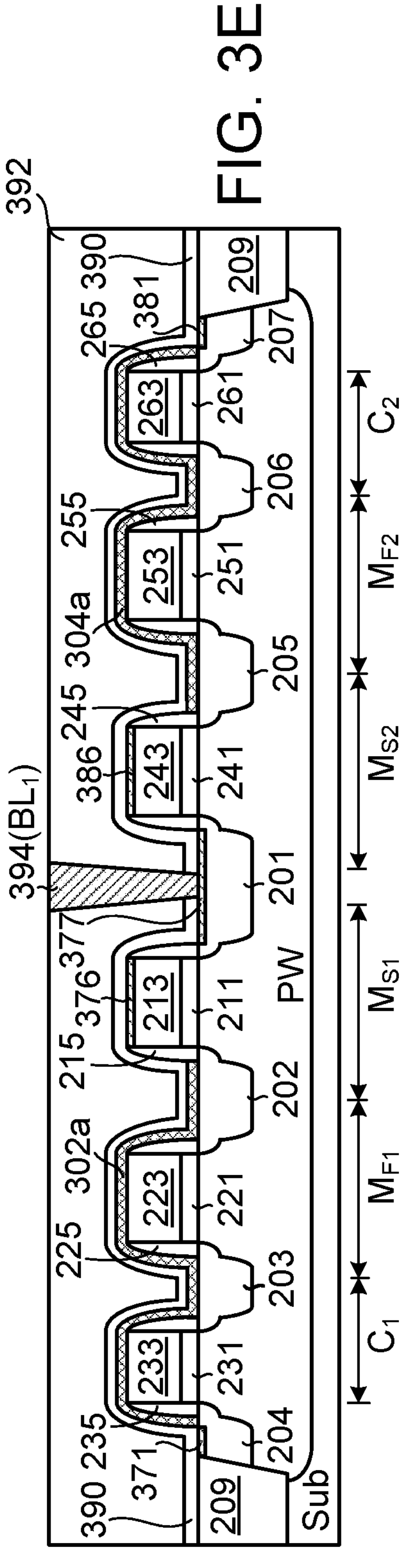
FIG. 3E is a schematic cross-sectional view illustrating the array structure as shown in FIG. 3D and taken along the dashed line A'B'.

For example, FIG. 3D is a schematic top view modified based on the second embodiment of FIG. 3A, and FIG. 3E is a schematic cross-sectional view illustrating the array structure as shown in FIG. 3D and taken along the dashed line A'B'. As shown in FIG. 3D and FIG. 3E, the protecting layer 302*a* further covers the third gate structure and the protecting layer 304*a* further covers the sixth gate structure in comparison with the second embodiment.

Moreover, as shown in FIG. 3D, the third gate structure and the sixth gate structure are not completely covered by the protecting layers 302*a* and 304*a*. That is, electrical contact layers 372 and 382 are contacted with a portion of the third gate structure and a portion of the sixth gate structure, respectively. As shown in FIG. 3D, the electrical contact layers 372 and 382 are respectively contacted with the exposed surfaces of the gate layers 233 and 263 that are not covered by the protecting layers 302*a* and 304*a*. That is, the electrical contact layer 372 is formed on an exposed surface of the gate layer 233 that is not covered by the protecting layers 302*a*, and the electrical contact layer 372 is not formed on the surface of the gate layer 233 that is covered by the protecting layers 302*a*.

Furthermore, in the memory cell of the second embodiment as shown in FIG. 3C and FIG. 3E, the electrical contact layers 371 and 381 are respectively formed on the surfaces of the n-doped regions 204 and 207. In addition, the n-doped regions 204 and 207 are always in the floating state. It is noted that numerous modifications and alterations may be made while retaining the teachings of the invention. For example, in another embodiment, the surfaces of the n-doped regions 204 and 207 are also covered by protecting layers. Consequently, no electrical contact layers are formed on the surfaces of the n-doped regions 204 and 207. Alternatively, in some other embodiments, the n-doped regions 204 and 207 are not formed in the P-well region PW.

Moreover, the memory cell of the second embodiment is a 2T1C memory cell. It is noted that the concepts of the present invention may be applied to the memory cells with other structures. For example, the technologies of the present invention can be also applied to a 1T1C memory cell or a 4T1C memory cell. The related expanded applications will be described as follows.

Figure 4A:
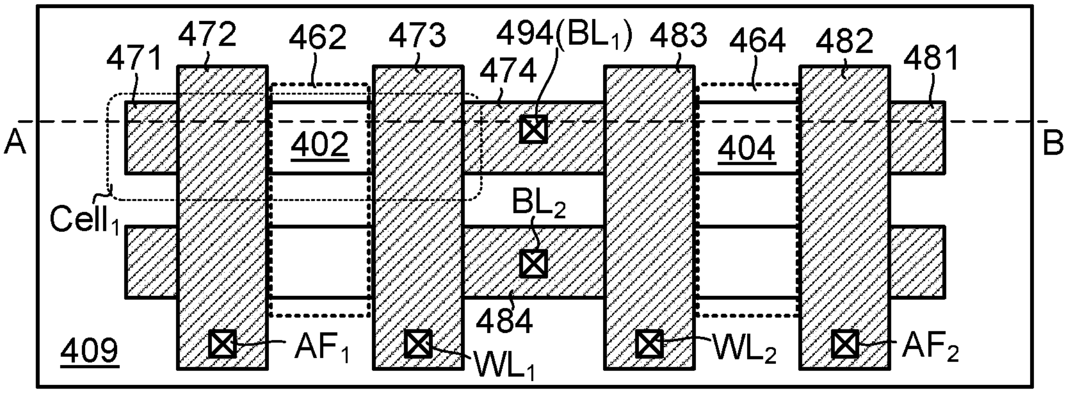
FIG. 4A is a schematic top view illustrating an array structure with memory cells according to a third embodiment of the present invention.
Figure 4B:
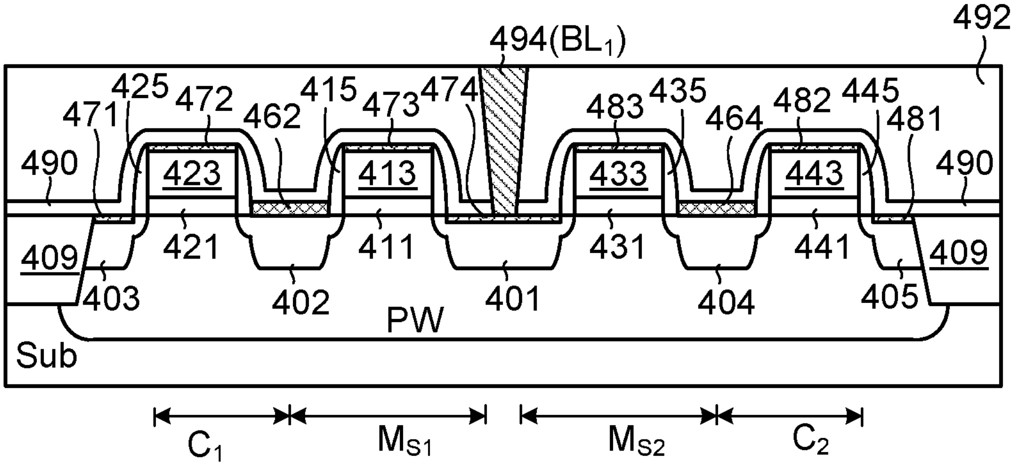
FIG. 4B is a schematic cross-sectional view illustrating the array structure as shown in FIG. 4A and taken along the dashed line AB.
Figure 4C:
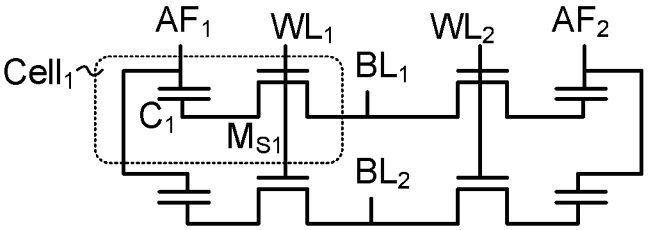
FIG. 4C is a schematic equivalent circuit of the array structure according to the third embodiment of the present invention.

FIG. 4A is a schematic top view illustrating an array structure with memory cells according to a third embodiment of the present invention. FIG. 4B is a schematic cross-sectional view illustrating the array structure as shown in FIG. 4A and taken along the dashed line AB. FIG. 4C is a schematic equivalent circuit of the array structure according to the third embodiment of the present invention. Since the antifuse-type non-volatile memory cell of this embodiment includes one transistor and one capacitor, the antifuse-type non-volatile memory cell may be referred as a 1T1C cell.

Please refer to FIG. 4B. Firstly, plural isolation structures 409 are formed in a semiconductor substrate Sub. In addition, a P-well region PW is formed in the surface of the semiconductor substrate Sub and arranged between the plural isolation structures 409. For example, the isolation structures 409 are shallow trench isolation (STI) structures.

Then, four gate structures are formed over the surface of the P-well region PW. The first gate structure comprises a gate dielectric layer 411, a gate layer 413 and a spacer 415. The second gate structure comprises a gate dielectric layer 421, a gate layer 423 and a spacer 425. The third gate structure comprises a gate dielectric layer 431, a gate layer 433 and a spacer 435. The fourth gate structure comprises a gate dielectric layer 441, a gate layer 443 and a spacer 445.

Then, a doping process is performed. An n-doped region 401 is formed under the surface of the P-well region PW and arranged between a first side of the first gate structure and a first side of the third gate structure. An n-doped region 402 is formed under the surface of the P-well region and arranged between a second side of the first gate structure and a first side of the second gate structure. An n-doped region 403 is formed under the surface of the P-well region and arranged beside a second side of the second gate structure. An n-doped region 404 is formed under the surface of the P-well region and arranged between a second side of the third gate structure and a first side of the fourth gate structure. An n-doped region 405 is formed under the surface of the P-well region and arranged beside a second side of the fourth gate structure.

Before the electrical contact layer formation process, two protecting layers 462 and 464 are formed. The protecting layers 462 and 464 fully cover the surfaces of the n-doped regions 402 and 404. Consequently, no silicide spike material can be formed in the n-doped regions 402 and 404. As shown FIG. 4B, the surface of the n-doped region 402 between the first gate structure and the second gate structure is covered by the protecting layer 462. In addition, the surface of the n-doped region 404 between the third gate structure and the fourth gate structure is covered by the protecting layer 464.

After the electrical contact layer formation process, electrical contact layers 471, 474 and 481 are contacted with the surfaces of the n-doped regions 403, 401 and 405, respectively. Furthermore, electrical contact layers 473, 472, 483 and 482 are contacted with the first gate structure, the second gate structure, the third gate structure and the fourth gate structure, respectively. That is, the electrical contact layers 473, 472, 483 and 482 are contacted with the surfaces of the gate layers 413, 423, 433 and 443, respectively.

Then, a connecting line process is performed. A contact etching stop layer (also referred as a CESL layer) 490 is formed over the semiconductor substrate Sub, and an interlayer dielectric layer (also referred as an IDL layer) 492 is formed over the CESL layer 490. As shown in FIG. 4B, a conducting line 494 is formed. The conducting line 494 is electrically connected with the electrical contact layer 474. The conducting line 494 is served as a bit line $BL_1$.

After the conducting line formation process is completed, some other conducting lines are formed. For example, as shown in FIG. 4A, the conducting line connected with the electrical contact layer 472 is served as an antifuse control line $AF_1$. The conducting line connected with the electrical contact layer 473 is served as a word line $WL_1$. The conducting line connected with the electrical contact layer 482 is served as an antifuse control line $AF_2$. The conducting line connected with the electrical contact layer 483 is served as a word line $WL_2$. The conducting line connected with the electrical contact layer 484 is formed as a bit line $BL_2$.

Please refer to FIG. 4B. The P-well region PW, the first gate structure, the n-doped regions 401 and 402 are collaboratively formed as a select transistor $M_{S1}$. The second gate structure and the n-doped region 402 are collaboratively formed as a capacitor $C_1$. The P-well region PW, the third gate structure, the n-doped region 401 and the n-doped region 404 are collaboratively formed as a select transistor $M_{S2}$. The fourth gate structure and the n-doped region 404 are collaboratively formed as a capacitor $C_2$. In the first embodiment of the present invention, a memory cell $Cell_1$ comprises the capacitor $C_1$ and the select transistor $M_{S1}$, and another memory cell comprises the capacitor $C_2$ and the select transistor $M_{S2}$.

As shown in FIG. 4C, the array structure comprises four memory cells with the same structures. The connection relationship between the components of the memory cell $Cell_1$ will be illustrated as an example. In the memory cell $Cell_1$, the first drain/source terminal of the select transistor $M_{S1}$ is connected with the bit line $BL_1$. The gate terminal of the select transistor $M_{S1}$ is connected with the word line $WL_1$. The first terminal of the capacitor $C_1$ is connected with the second drain/source terminal of the select transistor $M_{S1}$. The second terminal of the capacitor $C_1$ is connected with the antifuse control line $AF_1$.

By providing proper bias voltages to the bit line $BL_1$, the word line $WL_1$ and the antifuse control line $AF_1$, the memory cell $Cell_1$ can be programmed. For example, in case that the memory cell is not programmed, the gate dielectric layer 421 of the capacitor $C_1$ is not ruptured. Consequently, the memory cell $Cell_1$ is in a high-resistance storage state. Whereas, in case that the memory cell is programmed, the gate dielectric layer 421 of the capacitor $C_1$ is ruptured. Consequently, the memory cell $Cell_1$ is in a low-resistance storage state.

Similarly, in some embodiments, the protecting layers 462 and 464 of the third embodiment shown in FIG. 4B may respectively extend to cover the second gate structure and the fourth gate structure. Or, the protecting layers 462 and 464 may respectively extend to cover the first gate structure and the third gate structure. Or, the protecting layers 462 may extend to cover both the first gate structure and the second gate structure, and the protecting layers 464 may extend to cover both the third gate structure and the fourth gate structure.

Furthermore, in the memory cell of the third embodiment as shown in FIG. 4B, the electrical contact layers 471 and 481 are formed on the surfaces of the n-doped regions 403 and 405. It is noted that numerous modifications and alterations may be made while retaining the teachings of the invention. For example, in another embodiment, the surfaces of the n-doped regions 403 and 405 are also covered by protecting layer. Consequently, no electrical contact layers are not formed on the surfaces of the n-doped regions 403 and 405. Alternatively, in some other embodiments, the n-doped regions 403 and 405 are not formed in the P-well region PW.

Figures 5A, 5B, 5C:
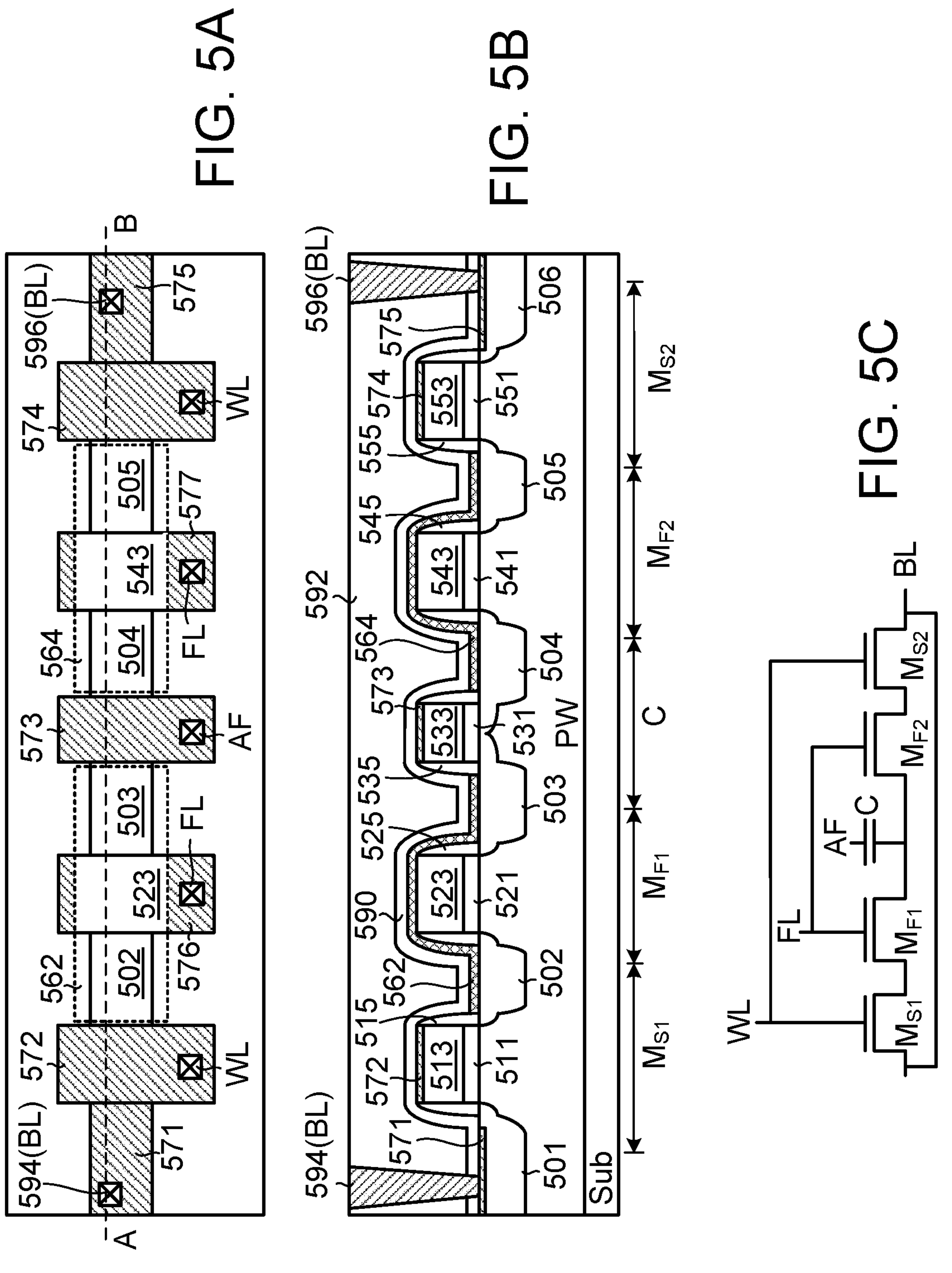
FIG. 5A is a schematic top view illustrating a memory cell according to a fourth embodiment of the present invention.
FIG. 5B is a schematic cross-sectional view illustrating the memory cell as shown in FIG. 4A and taken along the dashed line AB.
FIG. 5C is a schematic equivalent circuit of the memory cell according to the fourth embodiment of the present invention.

FIG. 5A is a schematic top view illustrating a memory cell according to a fourth embodiment of the present invention. FIG. 5B is a schematic cross-sectional view illustrating the memory cell as shown in FIG. 4A and taken along the dashed line AB. FIG. 5C is a schematic equivalent circuit of the memory cell according to the fourth embodiment of the present invention. Since the antifuse-type non-volatile memory cell of this embodiment includes four transistors and one capacitor, the antifuse-type non-volatile memory cell may be referred as a 4T1C cell.

Please refer to FIG. 5B. Firstly, a P-well region PW is formed in the surface of a semiconductor substrate Sub. Then, five gate structures are formed over the surface of the P-well region PW. The first gate structure comprises a gate dielectric layer 511, a gate layer 513 and a spacer 515. The second gate structure comprises a gate dielectric layer 521, a gate layer 523 and a spacer 525. The third gate structure comprises a gate dielectric layer 531, a gate layer 533 and a spacer 535. The fourth gate structure comprises a gate dielectric layer 541, a gate layer 543 and a spacer 545. The fifth gate structure comprises a gate dielectric layer 551, a gate layer 553 and a spacer 555.

Then, a doping process is performed. An n-doped region 501 is formed under the surface of the P-well region PW and arranged beside a first side of the first gate structure. An n-doped region 502 is formed under the surface of the P-well region and arranged between a second side of the first gate structure and a first side of the second gate structure. An n-doped region 503 is formed the under the surface of the P-well region and arranged between a second side of the second gate structure and a first side of the third gate structure. An n-doped region 504 is formed under the surface of the P-well region and arranged between a second side of the third gate structure and a first side of the fourth gate structure. An n-doped region 505 is formed under the surface of the P-well region and arranged between a second side of the fourth gate structure and a first side of the fifth gate structure. An n-doped region 506 is formed under the surface of the P-well region and arranged beside a second side of the fifth gate structure. Preferably, the width of the third gate structure is narrower. Consequently, the two n-doped regions 503 and 504 are contacted with each other and merged as a merged n-doped region. Of course, in case that the two n-doped regions 503 and 504 are not contacted with each other, the memory cell is still feasible.

Before the electrical contact layer formation process, two protecting layers 562 and 564 are formed. The protecting layers 562 and 564 fully cover the surfaces of the n-doped regions 502, 503, 504 and 505. Consequently, no silicide spike material can be formed in the n-doped regions 50,502, 503 and 504. As shown in FIGS. 5A and 5B, the second gate structure and the surfaces of the n-doped regions 502 and 503 are covered by the protecting layer 562. The fourth gate structure and the surface of the n-doped regions 504 and 505 are covered by the protecting layer 564. In some embodiments, at least part of the gate layer 523 and the spacer 525 are also covered by the protecting layer 562, and at least part of the gate layer 543 and the spacer 545 are covered by the protecting layer 564.

After the electrical contact layer formation process, electrical contact layers 571 and 575 are contacted with the surfaces of the n-doped regions 501 and 506, respectively. Furthermore, electrical contact layers 572, 573 and 574 are contacted with the first gate structure, the third gate structure and the fifth gate structure, respectively. That is, the electrical contact layers 572, 573 and 574 are contacted with the surfaces of the gate layers 513, 533 and 553, respectively. As shown in FIG. 5A, the second gate structure and the fourth gate structure are not completely covered by the protecting layers 562 and 564. That is, electrical contact layers 576 and 577 are contacted with the second gate structure and the fourth gate structure, respectively. That is, the electrical contact layers 576 and 577 are contacted with portions of the surfaces of the gate layers 523 and 543, respectively.

Then, a connecting line process is performed. A contact etching stop layer (also referred as a CESL layer) 590 is formed over the semiconductor substrate Sub, and an inter-layer dielectric layer (also referred as an IDL layer) 592 is formed over the CESL layer 590. As shown in FIG. 5B, two conducting lines 594 and 596 are formed. The conducting line 594 is electrically connected with the electrical contact layer 571. The conducting line 594 is served as a bit line BL. The conducting line 596 is electrically connected with the electrical contact layer 575. The conducting line 596 is also served as the bit line BL.

After the conducting line formation process is completed, some other conducting lines are formed. Please refer to FIG. 5A. The conducting line connected with the electrical contact layer 573 is served as an antifuse control line AF. The conducting line connected with the electrical contact layer 576 is served as a following line FL. The conducting line connected with the electrical contact layer 577 is also served as the following line FL. The conducting line connected with the electrical contact layer 572 is served as a word line WL. The conducting line connected with the electrical contact layer 574 is also served as the word line WL.

Please refer to FIG. 5B. The P-well region PW, the first gate structure, the n-doped regions 501 and 502 are collaboratively formed as a select transistor $M_{S1}$. The P-well region PW, the gate structure, the n-doped region 502 and the n-doped region 503 are collaboratively formed as a following transistor $M_{F1}$. The third gate structure, the n-doped region 503 and the n-doped region 504 are collaboratively formed as a capacitor C. The P-well region PW, the fourth gate structure, the n-doped regions 504 and the n-doped region 505 are collaboratively formed as a following transistor $M_{F2}$. The P-well region PW, the fifth gate structure, the n-doped regions 505 and the n-doped region 506 are collaboratively formed as a select transistor $M_{S2}$. Moreover, the memory cell of the fourth embodiment comprises the capacitor C, the two select transistors $M_{S1}$ and $M_{S2}$ and the two following transistors $M_{F1}$ and $M_{F2}$.

Please refer to FIG. 5C. In the memory cell, the first drain/source terminal of the select transistor $M_{S1}$ is connected with the bit line BL. The gate terminal of the select transistor $M_{S1}$ is connected with the word line WL. The first drain/source terminal of the following transistor $M_{F1}$ is connected with the second drain/source terminal of the select transistor $M_{S1}$. The gate terminal of the following transistor $M_{F1}$ is connected with the following line FL. The second drain/source terminal of the following transistor $M_{F1}$ is connected with the first terminal of the capacitor C. The second terminal of the capacitor C is connected with the antifuse control line AF. The first drain/source terminal of the select transistor $M_{S2}$ is connected with the bit line BL. The gate terminal of the select transistor $M_{S2}$ is connected with the word line WL. The first drain/source terminal of the following transistor $M_{F2}$ is connected with the second drain/source of the select transistor $M_{S2}$. The gate terminal of the following transistor $M_{F2}$. The second drain/source terminal of the following transistor $M_{F2}$ is connected with the first terminal of the capacitor C.

By providing proper bias voltages to the bit line BL, the word line WL, the antifuse control line AF and the following line FL, the memory cell Cell can be programed. For example, in case that the memory cell is not programmed, the gate dielectric layer 531 of the capacitor C is not ruptured. Consequently, the memory cell is in a high-resistance storage state. Whereas, in case that the memory cell is programmed, the gate dielectric layer 531 of the capacitor C is ruptured. Consequently, the memory cell is in a low-resistance storage state.

Similarly, in some embodiments, the protecting layers 562 and 564 of the fourth embodiment shown in FIG. 5B may respectively extend to cover the first gate structure and the fifth gate structure. Or, the protecting layers 562 and 564 may extend to contact with each other and cover the third gate structure. Or, the contacted protecting layers 462 and 464 may extend to cover the five gate structures.

Figure 6A:
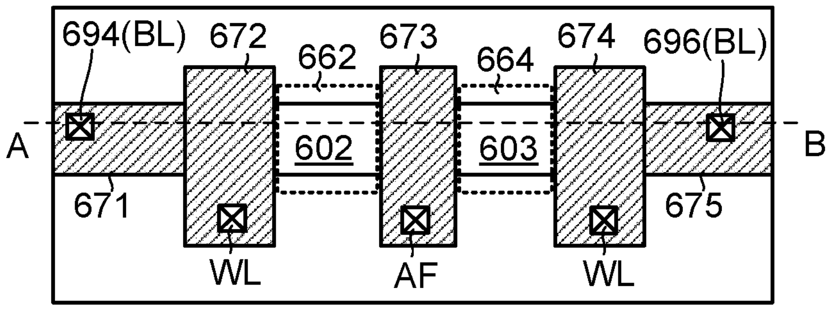
FIG. 6A is a schematic top view illustrating a memory cell according to a fifth embodiment of the present invention.
Figure 6B:
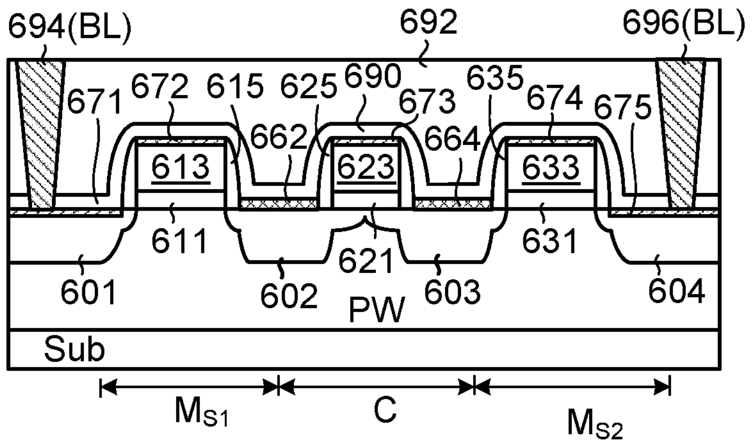
FIG. 6B is a schematic cross-sectional view illustrating the memory cell as shown in FIG. 6A and taken along the dashed line AB.
Figure 6C:
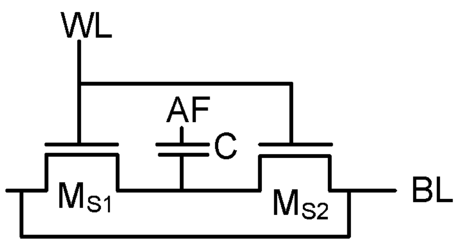
FIG. 6C is a schematic equivalent circuit of the memory according to the fifth embodiment of the present invention.

FIG. 6A is a schematic top view illustrating a memory cell according to a fifth embodiment of the present invention. FIG. 6B is a schematic cross-sectional view illustrating the memory cell as shown in FIG. 6A and taken along the dashed line AB. FIG. 6C is a schematic equivalent circuit of the memory according to the fifth embodiment of the present invention. Since the antifuse-type non-volatile memory cell of this embodiment includes two transistors and one capacitor, the antifuse-type non-volatile memory cell may be referred as a 2T1C cell.

Please refer to FIG. 6B. Firstly, a P-well region PW is formed in the surface of a semiconductor substrate Sub. Then, three gate structures are formed over the surface of the P-well region PW. The first gate structure comprises a gate dielectric layer 611, a gate layer 613 and a spacer 615. The second gate structure comprises a gate dielectric layer 621, a gate layer 623 and a spacer 625. The third gate structure comprises a gate dielectric layer 631, a gate layer 633 and a spacer 635.

Then, a doping process is performed. An n-doped region 601 is formed under the surface of the P-well region PW and arranged beside a first side of the first gate structure. An n-doped region 602 is formed under the surface of the P-well region PW and arranged between a second side of the first gate structure and a first side of the second gate structure. An n-doped region 603 is formed under the surface of the P-well region PW and arranged between a second side of the second gate structure and a first side of the third gate structure. An n-doped region 604 is formed under the surface of the P-well region PW and arranged beside a second side of the third gate structure. Preferably, the width of the second gate structure is narrower. Consequently, the two n-doped regions 602 and 603 are contacted with each other and merged as a merged n-doped region. Of course, in case that the two n-doped regions 602 and 603 are not contacted with each other, the memory cell is still feasible.

Before the electrical contact layer formation process, two protecting layers 662 and 664 are formed. The protecting layers 662 and 664 fully cover the surfaces of the n-doped regions 602 and 603. Consequently, no silicide spike material can be formed in the n-doped regions 602 and 603. As shown in FIGS. 6A and 6B, the surface of the n-doped region 602 is covered by the protecting layer 662. The surface of the n-doped region 603 is covered by the protecting layer 664.

After the electrical contact layer formation process, electrical contact layers 671 and 675 are contacted with the surfaces of the n-doped regions 601 and 604, respectively. Furthermore, electrical contact layers 672, 673 and 674 are contacted with the first gate structure, the second gate structure and the third gate structure, respectively. That is, the electrical contact layers 672, 673 and 674 are contacted with the surfaces of the gate layers 613, 623 and 633, respectively.

Then, a connecting line process is performed. A contact etching stop layer (also referred as a CESL layer) 690 is formed over the semiconductor substrate Sub, and an inter-layer dielectric layer (also referred as an IDL layer) 692 is formed over the CESL layer 690. Then, as shown in FIG. 6B, two conducting lines 694 and 696 are formed. The conducting line 694 is electrically connected with the electrical contact layer 671. The conducting line 694 is served as a bit line BL. The conducting line 696 is electrically connected with the electrical contact layer 675. The conducting line 696 is also served as the bit line BL.

After the conducting line formation process is completed, some other conducting lines are formed. Please refer to FIG. 6A. The conducting line connected with the electrical contact layer 673 is served as an antifuse control line AF. The conducting line connected with the electrical contact layer 672 is served as a word line WL. The conducting line connected with the electrical contact layer 674 is also served as the word line WL.

Please refer to FIG. 6B. The P-well region PW, the first gate structure, the n-doped region 601 and the n-doped region 602 are collaboratively formed as a select transistor $M_{S1}$. The second gate structure, the n-doped region 602 and the n-doped region 603 are collaboratively formed as a capacitor C. The P-well region PW, the third gate structure, the n-doped region 603 and the n-doped region 604 are collaboratively formed as a select transistor $M_{S2}$. Moreover, a memory cell of the fifth embodiment comprises the capacitor C and the two select transistors Ms and $M_{S2}$.

Please refer to FIG. 6C. In the memory cell, the first drain/source terminal of the select transistor $M_{S1}$ is connected with the bit line BL. The gate terminal of the select transistor $M_{S1}$ is connected with the word line WL. The second drain/source terminal of the select transistor $M_{S1}$ is connected with the first terminal of the capacitor C. The second terminal of the capacitor C is connected with the antifuse control line AF. The first drain/source terminal of the select transistor $M_{S2}$ is connected with the bit line BL. The gate terminal of the select transistor $M_{S2}$ is connected with the word line WL. The second drain/source terminal of the select transistor $M_{S2}$ is connected with the first terminal of the capacitor C.

By providing proper bias voltages to the bit line BL, the word line WL and the antifuse control line AF, the memory cell can be programed. For example, in case that the memory cell is not programmed, the gate dielectric layer 621 of the capacitor C is not ruptured. Consequently, the memory cell is in a high-resistance storage state. Whereas, in case that the memory cell is programmed, the gate dielectric layer 621 of the capacitor C is ruptured. Consequently, the memory cell is in a low-resistance storage state.

Similarly, in some embodiments, the protecting layers 662 and 664 of the fifth embodiment shown in FIG. 6B may respectively extend to cover the first gate structure and the third gate structure. Or, the protecting layers 662 and 664 may extend to contact with each other and cover the second gate structure. Or, the contacted protecting layers 562 and 564 may extend to cover the three gate structures As mentioned above, the present invention provides an antifuse-type non-volatile memory cell. Before the electrical contact layer formation process, a protecting layer is formed to completely cover a surface of a specified n-doped region. Consequently, no electrical contact layer can be formed on the surface of the specified n-doped region. Under this circumstance, silicide spike material cannot be formed in the specified n-doped region. During the program action of the memory cell, the program disturbance can be reduced, and the program fail problem can be solved.

In the above embodiments, the transistors in the memory cell are n-type transistors. In some other embodiments, the transistors in the memory cell are p-type transistors. That is, before the electrical contact layer formation process, a protecting layer is formed to completely cover a surface of a specified p-doped region in the N-well region. Consequently, no electrical contact layer can be formed on the surface of the specified p-doped region. Under this circumstance, silicide spike material cannot be formed in the specified p-doped region.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An antifuse-type non-volatile memory cell, comprising:

a semiconductor substrate;

a well region formed in the semiconductor substrate;

a first gate structure, a second gate structure and a third gate structure formed over a surface of the well region;

a first doped region, a second doped region and a third doped region, wherein the first doped region is formed under the surface of the well region and arranged beside a first side of the first gate structure, the second doped region is formed under the surface of the well region and arranged between a second side of the first gate structure and a first side of the second gate structure, and the third doped region is formed under the surface of the well region and arranged between a second side of the second gate structure and a first side of the third gate structure;

a first protecting layer, wherein a surface of the second doped region and a surface of the third doped region are completely covered by the first protecting layer to prevent a formation of electrical contact layers on the surfaces of the second doped region and the third doped region;

a first electrical contact layer, a second electrical contact layer, a third electrical contact layer and a fourth electrical contact layer contacted with a surface of the first doped region, the first gate structure, the second gate structure and the third gate structure, respectively; and a first conducting line, a second conducting line, a third conducting line and a fourth conducting line electrically connected with the first electrical contact layer, the second electrical contact layer, the third electrical contact layer and the fourth electrical contact layer, respectively, wherein the well region, the first gate structure, the first doped region and the second doped region are collaboratively formed as a first select transistor, the well region, the second gate structure, the second doped region and the third doped region are collaboratively formed as a following transistor, and the third gate structure and the third doped region are collaboratively formed as a capacitor, wherein the antifuse-type non-volatile memory cell comprises the first select transistor, the first following transistor and the capacitor.

2. The antifuse-type non-volatile memory cell as claimed in claim 1, wherein a portion of the second gate structure is covered by the first protecting layer.

3. The antifuse-type non-volatile memory cell as claimed in claim 2, wherein the second gate structure comprises a gate dielectric layer, a gate layer and a spacer; a portion of the gate layer of the second gate structure is covered by the first protecting layer; and the third electrical contact layer is formed on an exposed surface of the gate layer of the second gate structure.

4. The antifuse-type non-volatile memory cell as claimed in claim 2, wherein a portion of the third gate structure is further covered by the first protecting layer.

5. The antifuse-type non-volatile memory cell as claimed in claim 4, wherein the third gate structure comprises a gate dielectric layer, a gate layer and a spacer; a portion of the gate layer of the third gate structure is covered by the first protecting layer; and the fourth electrical contact layer is formed on an exposed surface of the gate layer of the third gate structure.

6. The antifuse-type non-volatile memory cell as claimed in claim 1, wherein the first gate structure comprises a first gate dielectric layer, a first gate layer and a first spacer, the second gate structure comprises a second gate dielectric layer, a second gate layer and a second spacer, and the third gate structure comprises a third gate dielectric layer, a third gate layer and a third spacer, wherein the second electrical contact layer is contacted with a surface of the first gate layer, the third electrical contact layer is contacted with a surface of the second gate layer, and the fourth electrical contact layer is contacted with a surface of the third gate layer.

7. The antifuse-type non-volatile memory cell as claimed in claim 1, wherein the antifuse-type non-volatile memory cell further comprises a contact etching stop layer and an interlayer dielectric layer, wherein the contact etching stop layer is arranged above the first electrical contact layer, the first gate structure, the second electrical contact layer, the first protecting layer, the third gate structure and the fourth electrical contact layer, and the contact etching stop layer is covered by the interlayer dielectric layer.

8. The antifuse-type non-volatile memory cell as claimed in claim 1, wherein the first conducting line is served as a bit line, the second conducting line is served as a word line, the third conducting line is served as a following line, and the fourth conducting line is served as an antifuse control line.

9. The antifuse-type non-volatile memory cell as claimed in claim 8, wherein a first drain/source terminal of the first select transistor is connected with the bit line, a gate terminal of the first select transistor is connected with the word line, a first drain/source terminal of the first following transistor is connected with a second drain/source terminal of the first select transistor, a gate terminal of the first following transistor is connected with the following line, a second drain/source terminal of the first following transistor is connected with a first terminal of the capacitor, and a second terminal of the capacitor is connected with the antifuse control line.

10. The antifuse-type non-volatile memory cell as claimed in claim 1, further comprising:

a fourth gate structure and a fifth gate structure formed on the surface of the well region;

a fourth doped region, a fifth doped region and a sixth doped region, wherein the fourth doped region is formed under the surface of the well region and arranged between a second side of the third gate structure and a first side of the fourth gate structure, the fifth doped region is formed under the surface of the well region and arranged between a second side of the fourth gate structure and a first side of the fifth gate structure, and the sixth doped region is formed under the surface of the well region and arranged beside a second side of the fifth gate structure;

a second protecting layer, wherein a surface of the fourth doped region and a surface of the fifth doped region are completely covered by the second protecting layer;

a fifth electrical contact layer, a sixth electrical contact layer and a seventh electrical contact layer contacted with the fourth gate structure, the fifth gate structure and a surface of the sixth doped region, respectively; and a fifth conducting line, a sixth conducting line and a seventh conducting line electrically contacted with the fifth electrical contact layer, the sixth electrical contact layer and the seventh electrical contact layer, respectively, wherein the well region, the fifth gate structure, the fifth doped region and the sixth doped region are collaboratively formed as a second select transistor, and the well region, the fourth gate structure, the fourth doped region and the fifth doped region are collaboratively formed as a second following transistor, wherein the antifuse-type non-volatile memory cell further comprises the second select transistor and the second following transistor.

11. The antifuse-type non-volatile memory cell as claimed in claim 10, wherein the third doped region and the fourth doped region are contacted with each other and merged as a merged doped region.

12. The antifuse-type non-volatile memory cell as claimed in claim 11, wherein a portion of the fourth gate structure is covered by the second protecting layer.

13. The antifuse-type non-volatile memory cell as claimed in claim 12, wherein the fourth gate structure comprises a gate dielectric layer, a gate layer and a spacer; a portion of the gate layer of the fourth gate structure is covered by the second protecting layer; and the fifth electrical contact layer is formed on an exposed surface of the gate layer of the fourth gate structure.

14. The antifuse-type non-volatile memory cell as claimed in claim 12, wherein a portion of the third gate structure is further covered by the second protecting layer and the second protecting layer is contacted with the first protecting layer.

15. The antifuse-type non-volatile memory cell as claimed in claim 14, wherein the third gate structure comprises a gate dielectric layer, a gate layer and a spacer; a portion of the gate layer of the third gate structure is covered by the second protecting layer; and the fourth electrical contact layer is formed on an exposed surface of the gate layer of the third gate structure.

* * * * *